United States Patent
Ewe et al.

(10) Patent No.: US 7,821,128 B2
(45) Date of Patent: Oct. 26, 2010

(54) POWER SEMICONDUCTOR DEVICE HAVING LINES WITHIN A HOUSING

(75) Inventors: Henrik Ewe, Burglengenfeld (DE); Josef Hoeglauer, Munich (DE); Erwin Huber, Villach (AT); Ralf Otremba, Kaufbeuren (DE)

(73) Assignee: Infineon Technologies AG, Munich (DE)

( * ) Notice: Subject to any disclaimer, the term of this patent is extended or adjusted under 35 U.S.C. 154(b) by 917 days.

(21) Appl. No.: 11/468,112

(22) Filed: Aug. 29, 2006

(65) Prior Publication Data
US 2007/0045745 A1    Mar. 1, 2007

(30) Foreign Application Priority Data
Aug. 30, 2005    (DE)    ........................ 10 2005 041 174

(51) Int. Cl.
*H01L 23/34* (2006.01)
(52) U.S. Cl. ........................ 257/724; 257/776; 257/777; 257/E23.01; 257/E23.014
(58) Field of Classification Search ........................ None
See application file for complete search history.

(56) References Cited

U.S. PATENT DOCUMENTS

| 5,532,512 | A | * | 7/1996 | Fillion et al. | ................. | 257/686 |
|---|---|---|---|---|---|---|
| 6,031,279 | A | | 2/2000 | Lenz | ........................... | 257/686 |
| 6,774,466 | B1 | * | 8/2004 | Kajiwara et al. | ............. | 257/673 |
| 6,881,071 | B2 | | 4/2005 | Heilbronner | ................... | 439/67 |
| 7,183,655 | B2 | * | 2/2007 | Nishioka | ...................... | 257/777 |
| 7,262,444 | B2 | * | 8/2007 | Fillion et al. | ................. | 257/177 |
| 7,479,691 | B2 | * | 1/2009 | Ewe et al. | ..................... | 257/666 |
| 7,524,775 | B2 | * | 4/2009 | Ewe et al. | ..................... | 438/778 |
| 2001/0052641 | A1 | * | 12/2001 | Kuo et al. | ..................... | 257/686 |
| 2002/0113299 | A1 | * | 8/2002 | Kinsman et al. | ............. | 257/669 |
| 2002/0173192 | A1 | | 11/2002 | Heilbronner | ................ | 439/329 |
| 2005/0146005 | A1 | * | 7/2005 | Shimoishizaka et al. | .... | 257/678 |
| 2005/0224945 | A1 | * | 10/2005 | Saito et al. | ................... | 257/686 |

FOREIGN PATENT DOCUMENTS

| DE | 19635582 C1 | 2/1998 |
|---|---|---|
| DE | 10121970 A1 | 11/2002 |
| DE | 102004019443 B3 | 8/2005 |

* cited by examiner

*Primary Examiner*—Alonzo Chambliss
(74) *Attorney, Agent, or Firm*—Banner & Witcoff, Ltd.

(57) ABSTRACT

A power semiconductor device has a semiconductor chip stack and lines within a housing. The lines electrically connect large-area contact regions of power semiconductor device components within the housing to one another. In this case, at least one of the lines has a large-area planar conductive layer. This planar conductive area electrically connects the large-area contact regions to one another.

22 Claims, 6 Drawing Sheets

POWER SEMICONDUCTOR DEVICE HAVING LINES WITHIN A HOUSING

PRIORITY

This application claims priority from German Patent Application No. DE 10 2005 041 174.6, which was filed on Aug. 30, 2005, and is incorporated herein by reference in its entirety.

TECHNICAL FIELD

The invention relates to a power semiconductor device having a semiconductor chip stack within a housing and having lines which electrically connect large-area contact regions of power semiconductor device components within the housing to one another. In particular, the invention relates to a power semiconductor device having power field effect transistors connected in a bridge circuit, parallel circuit or series circuit, the power semiconductor device having a base power semiconductor chip with large-area external electrodes on the top and rear sides and carrying at least one stacked semiconductor chip as a power semiconductor chip, as a control chip and/or as a logic chip, which chip is surface-mounted, using at least one large-area electrode, on a correspondingly large external electrode of the top side of the base power semiconductor chip.

BACKGROUND

The document DE 196 35 582 C1 discloses a power semiconductor component for bridge circuits having so-called high-side switches or low-side switches, which component has a first base power semiconductor chip containing a vertical first transistor. A further, second power semiconductor chip having a second vertical transistor is mounted on the first base power semiconductor chip, so that the conduction paths of the two transistors are connected in series via the surface-mounted large-area contacts. An arrangement of this type can be extended in a simple manner to form a full bridge, as shown in FIGS. 6 and 7.

FIG. 6 shows the bridge circuit 616 of power semiconductor chips which is known from the prior art, the base power semiconductor chip 61 being mounted on a so-called cooling area 66 and containing two semiconductor switches H1, H2 which are insulated from one another on the source side. The two drain connections of the semiconductor switches H1 and H2 form the rear side of the base power semiconductor chip 61, said rear side being mounted on the cooling area 66. Two further power semiconductor chips 62 and 63 are then stacked on the source areas of the two transistors H1 and H2, said source areas being situated on the top side of the base power semiconductor chip 61.

These stacked power semiconductor chips 62 and 63 respectively have further power transistors L1 and L2. In this respect, the drain regions of the transistors L1 and L2 are mounted on the respective source region of the power transistors H1 and H2 and form the nodes 64 and 65 which can be connected via the respective external connections 610 and 614. The respective source regions of the power transistors L1 and L2 can likewise be contact-connected via the external connections 67 and 68 by bonding. The external connections 69, 611, 613 and 615 serve for driving the respective transistors H1, H2, L1 and L2 of the full bridge 616.

One realization of the bridge circuit 616 is shown in FIG. 7, in which the bridge circuit 616 is arranged in a surface-mountable housing 720 with external connections 722. In this case, the two source areas of the transistors H1 and H2 situated on the surface of the base power semiconductor device 61 are larger than the second and third stacked power semiconductor chips 62 and 63 mounted on them. As a result, contact can be made by the contact-making areas at the nodes 64 and 65 in a simple manner by means of bonding wires 724 and 726 with the external connections 722. The source areas of the semiconductor chips 62 and 63 are also likewise connected to respective externally accessible connections 722 from above by means of bonding wires 723 and 725.

This arrangement has the disadvantage that the drain connection basic areas of the low-side switches L1 and L2 contained in the power semiconductor chips 62 and 63 are dependent on the size of the respective source contact-making areas of the high-side switches H1 and H2 in the base power semiconductor chip 61. The base power semiconductor chip 61 thus does not permit any great variation possibilities as regards its large-area external contacts since the power semiconductor chips to be stacked are always surface-mounted in the prior art via the respective large-area external contacts present. The permissible current consumption of the bridge circuit branches is also significantly restricted by the limited size of the stacked power semiconductor components 62 and 63.

SUMMARY

A power semiconductor device may have a stack of power semiconductor chips, in which the design and type of the stacked semiconductor chips are not dependent on the areal extent of a source electrode or an emitter electrode of a power semiconductor chip, with the result that both the type of the stacked semiconductor chip and the arrangement and size of the stacked semiconductor chips can be varied.

A power semiconductor device may comprise a semiconductor chip stack and having lines within a housing which electrically connect large-area contact regions of power semiconductor device components within the housing to one another. To this end, at least one of the lines has a large-area planar conductive layer which electrically connects the large-area contact regions to one another.

BRIEF DESCRIPTION OF THE DRAWINGS

The invention will now be explained in more detail with reference to the accompanying figures.

DETAILED DESCRIPTION

Figure 7:
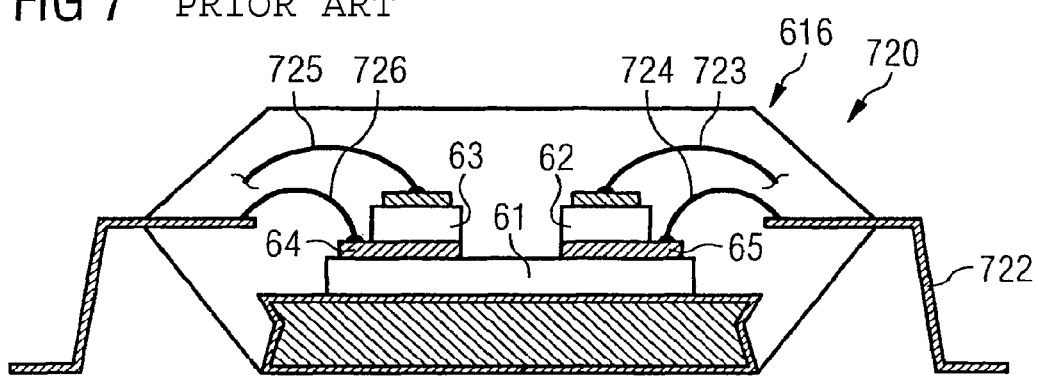
FIG. 7 shows a schematic cross section through a surface-mountable housing having the bridge circuit shown in FIG. 6.

A power semiconductor device of this type has the advantage that it is not only possible to stack power field effect transistors in a bridge circuit, parallel circuit or series circuit but it is possible to stack different semiconductor chips which undertake different functions, such as control functions or logic functions or functions of half-bridges and bridge paths, on the large-area planar conductive layer. This conductive layer also replaces the otherwise conventional bonding wires or bonding tapes which have hitherto surmounted gaps using a bonding arc, as appended FIG. 7 according to the document cited above discloses.

In one embodiment, the conductive layer bridges gaps between the components on a planar insulating carrier layer over a large area. Such a conductive layer having a planar insulating carrier layer has the advantage that it is possible to bridge large gaps which are produced between the individual power semiconductor device components and between which electrical connections need to be established.

In another embodiment, the semiconductor chip stack in the power semiconductor device has a semiconductor chip which is arranged, by way of its rear side, on the planar conductive layer. By way of its rear side, the semiconductor chip is thus at the same potential as the conductive layer provided that there is an electrically conductive connection involving a material joint between the rear side of the semiconductor chip and the conductive layer. Such a semiconductor chip may also be applied, by way of its rear side, to the planar conductive layer in an insulated manner, with the result that the planar conductive layer is merely used as a carrier for the stacked semiconductor chip. In this case, the connection involving a material joint comprises an insulating adhesive. In principle, any desired number of semiconductor chips having different functions may be applied to the planar conductive layer since the planar conductive layer is not solely restricted to the areal extent of the top side of the base power semiconductor chip.

In another embodiment, the planar conductive layer is patterned in the region of the stacked semiconductor chip, the pattern of the planar conductive layer being matched to a flip-chip arrangement of the stacked semiconductor chip. In principle, the planar conductive layer thus becomes a wiring pattern on which semiconductor chips having flip-chip contacts are stacked.

Provision is also made for the semiconductor chip stack to have, as a base semiconductor chip, a power semiconductor chip which has large-area electrodes on its top side and on its rear side. In the case of a field effect power device, these large-area electrodes may be a source electrode and a drain electrode and, in the case of a bipolar power transistor, may have an emitter electrode and a collector electrode.

In another embodiment, the rear side electrode of the power semiconductor chip is arranged on a large-area surface-mountable external contact of the power semiconductor device. Such a large-area and surface-mountable external contact has the advantage that the heat loss of the power semiconductor chip stack can be dissipated via such an external contact. It also has the advantage that a cooling area or a heat sink can be mounted on the external contact from the outside in order to be able to dissipate a larger heat loss.

In another embodiment, the top side of the base power semiconductor chip has a large-area second electrode which is connected to the planar conductive layer by a material joint. This is associated with the advantage that the conductive layer now forms a potential area which, in the case of an electrical connection to the second electrode of the base power semiconductor chip involving a material joint, keeps this potential ready for the stacked semiconductor chip.

In another embodiment, the large-area planar conductive layer bridges gaps between a flat lead chip pad and outer edge contacts on an edge side of the power semiconductor device. This has the advantage that the potential of the second electrode of the base power semiconductor chip can be connected to a plurality of outer edge contacts via the conductive layer without the need for bonding wire connections or bonding tape connections. To this end, the conductive layer may be supported by an insulating planar insulation layer.

Provision is also made for the large-area planar conductive layer to be matched to the edge contour of a base power semiconductor chip of the semiconductor chip stack. In this case, the edge contour may also ensure, by means of an insulating supporting layer which is arranged between the edge contour and the matched conductive layer, that structures of the base power semiconductor chip are not short-circuited by the conductive layer.

Provision is also made for the stacked semiconductor chip to be a logic chip or a control chip. This is associated with the advantage that, for example, bridge circuits can additionally be supplemented with logic and control chips which, for their part, are arranged on the conductive layer and have the potential of the second electrode on the top side of the base power semiconductor chip.

For a bridge circuit, the power semiconductor device has two large-area planar conductive layers which are arranged next to one another on corresponding source electrodes of a base power semiconductor chip having two high-side switches. Two power semiconductor chips are correspondingly arranged, as low-side switches of an H-bridge circuit, on these two large-area planar conductive layers, as is known from the prior art, but now using a conductive layer technology which enables a more reliable design in contrast to the H-bridge circuit which is known from the prior art and has lines solely comprising bonding wire connections. The susceptibility of such bonding wire connections is sufficiently well known from the relevant literature and is now overcome using the conductive layer, with the result that a power semiconductor device having a semiconductor chip stack is available, which has lines within a housing which are more reliable than the known bonding connection lines in the form of tapes or wires.

In summary, it can be established that the restriction on chip area which has hitherto existed in the prior art is eliminated by means of the chip-on-chip mounting, specified here, using a planar connecting technique by means of a conductive layer since, in this case, the stacked semiconductor chip can be arranged, in an electrically conductive or insulating manner, on the contact region of the base power semiconductor chip lying beneath it and the conductive layer can be extended, as desired, over the components of a base power semiconductor device. The conductive layer also makes it possible to implement multilayer application of the planar connecting technique or else a combination with wire bonding, flip-chip mounting and clip bonding technology.

Figure 1:
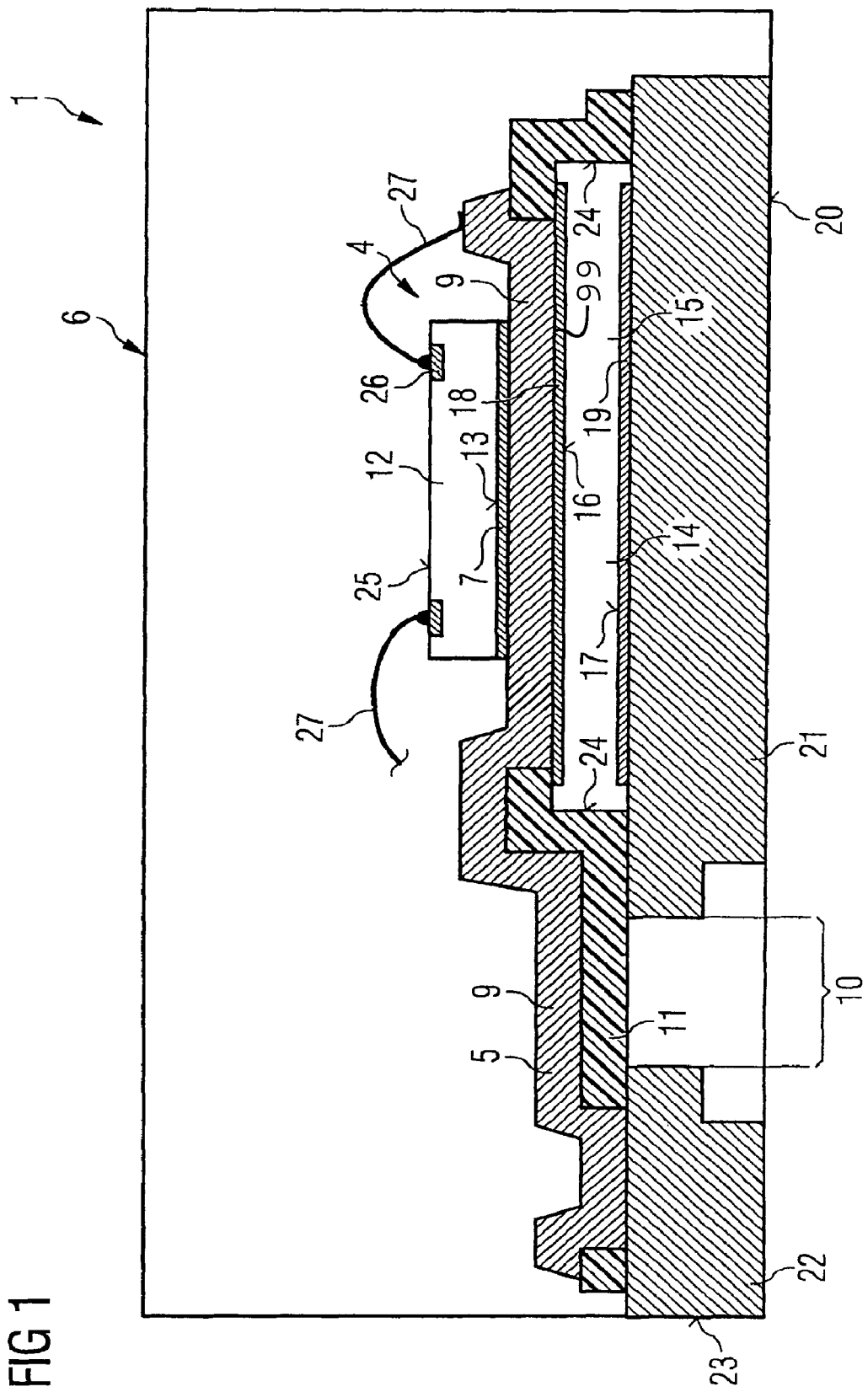
FIG. 1 shows a schematic cross section through a power semiconductor device of a first embodiment having a semiconductor chip stack.

FIG. 1 shows a schematic cross section through a power semiconductor device 1 of a first embodiment having a semiconductor chip stack 4 and having lines 5 within a housing 6. These lines 5 connect partially large-area contact regions 7 of power semiconductor device components within the housing 6 to one another and to outer edge contacts 22 on the edge sides 23 of the housing 6. At least one of these lines 5 has a large-area planar conductive layer 9. This large-area planar conductive layer 9 electrically connects the large-area contact regions 7 to one another and bridges gaps 10 between the components on a planar insulating carrier layer 11 over a large area. The components include a flat lead chip pad 21 having a large-area surface-mountable external contact 20 on which a base power semiconductor chip 15 is arranged by way of its large-area rear side electrode 19 of its rear side 17.

In this first embodiment, the planar conductive layer 9 is used to electrically connect outer edge contacts 22 to a large-area electrode 18 on the top side 16 of a base power semiconductor chip 14 via the gap 10. In addition, the areal extent of the planar conductive layer 9 is so large that it can be connected by a material joint to the rear side 13 of a stacked semiconductor chip 12. If this rear side 13 is intended to be connected to the potential of the conductive layer 9, the rear side 13 of the stacked semiconductor chip 12 is electrically connected to the conductive layer 9 via a conducting layer, while an insulating adhesive for connecting the stacked semiconductor chip 12 on the base power semiconductor chip 14 by a material joint can also be used in the case of potential isolation between the rear side 13 and the conductive layer 9.

In this embodiment, the stacked semiconductor chip 12 has contact areas 26 on its active top side 25, some of said contact areas likewise being intended to be connected to the potential of the conductive layer 9. This is effected using corresponding bonding wires 27 which connect the contact areas 26 of the stacked semiconductor chip 12 to the conductive layer 9. In principle, further semiconductor chips which undertake further functions can also be arranged on this large-area planar conductive layer 9.

Figure 2:
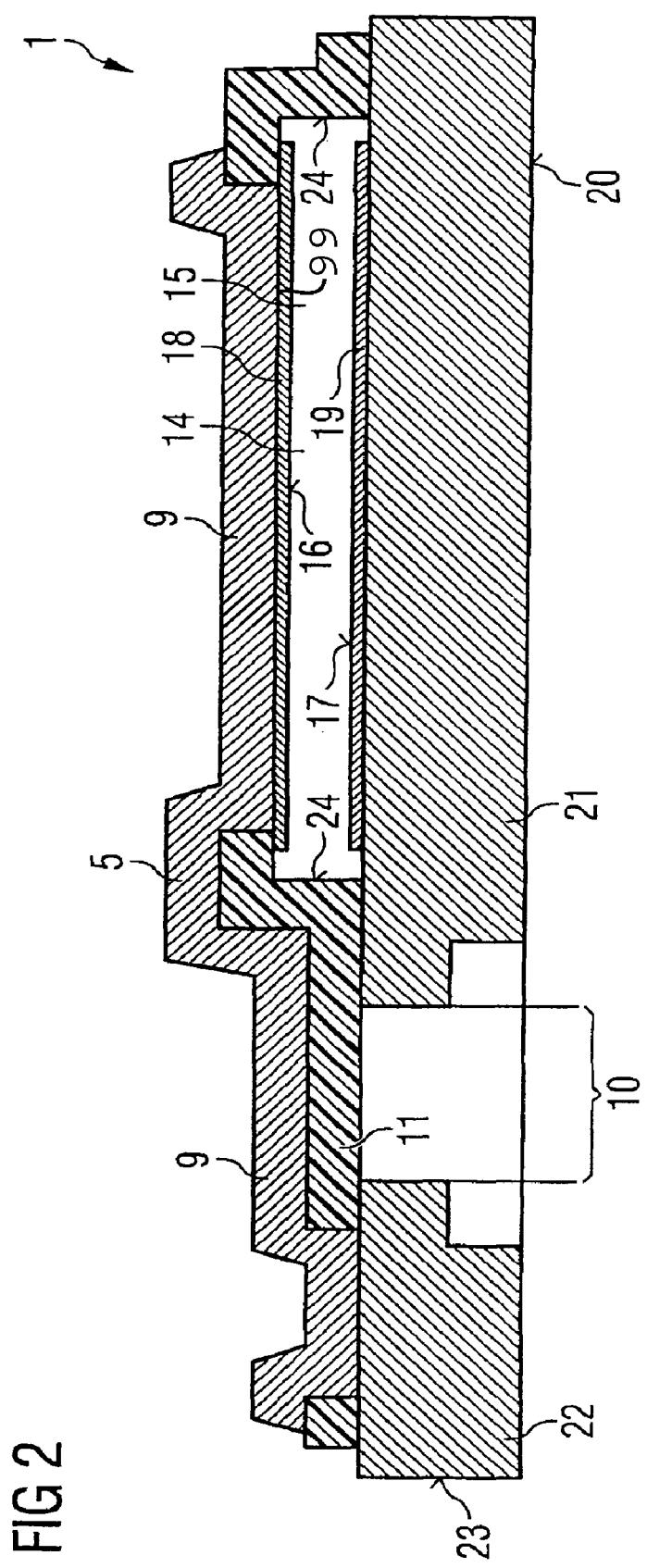
FIG. 2 shows a schematic cross section through a power semiconductor device of the first embodiment having a base power semiconductor chip before a stacked semiconductor chip is applied.

FIG. 2 shows a schematic cross section through a power semiconductor device 1 of the first embodiment having a base power semiconductor chip 14 before a stacked semiconductor chip is applied. The uppermost component of this structure is the large-area planar conductive layer 9 which, on the one hand, covers the large-area electrode 18 of the base power semiconductor chip 14 using a material joint 99 and, on the other hand, is matched to the edge contour 24 of this power semiconductor chip 15 in such a manner that it follows this edge contour 24 which is boosted using an insulating carrier layer 11. The insulating carrier layer 11 also bridges a gap 10 using the conductive layer 9 which then connects the large-area electrode 18 to outer edge contacts 23 of the housing. This region is also planar and can carry further semiconductor chips of a semiconductor module, if required.

Figure 3:
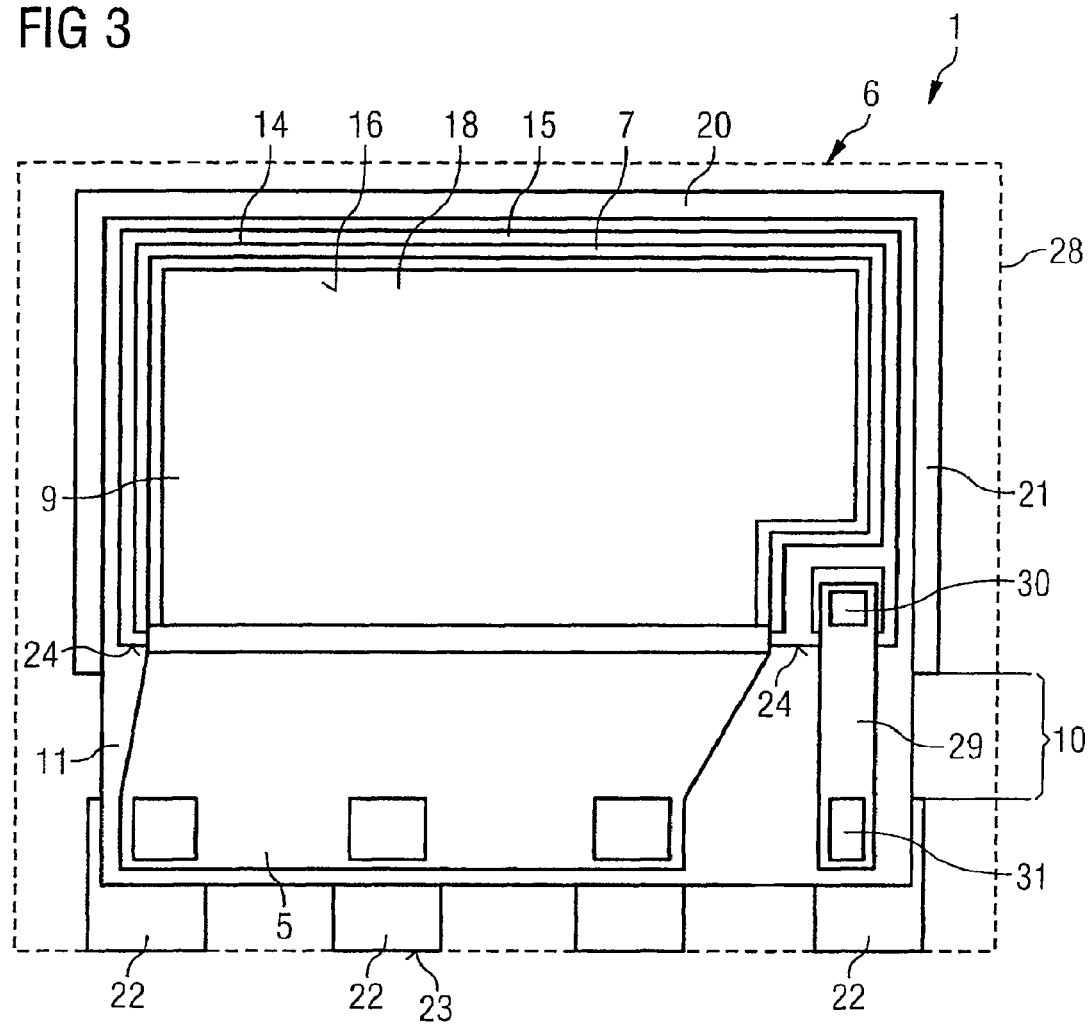
FIG. 3 shows a schematic plan view of the base power semiconductor chip shown in FIG. 2.

FIG. 3 shows a schematic plan view of the base power semiconductor chip 14 shown in FIG. 2, a dashed line 28 indicating the outlines of the subsequent plastic housing. In this phase of manufacture, a semiconductor chip is not yet arranged on the large-area conductive layer 9, and this illustration is also used to show that a multiplicity of semiconductor chips of different type can be stacked on the large-area conductive layer 9. In addition to the conductive layer 9 which follows the contour of the base power semiconductor chip 14 and extends as far as the outer edge contacts 22, a narrow conductor track 29 which comprises conductive layer material and extends from a gate electrode 30 on the top side 16 of the base power semiconductor chip 14 to a contact pad 31 of an outer edge contact 22 can be seen in this illustration. The conductive layer 9 is carried by a large-area planar insulating carrier layer 11 which is already applied to the components of the power semiconductor device 1 before the large-area conductive layer 9.

Figure 4:
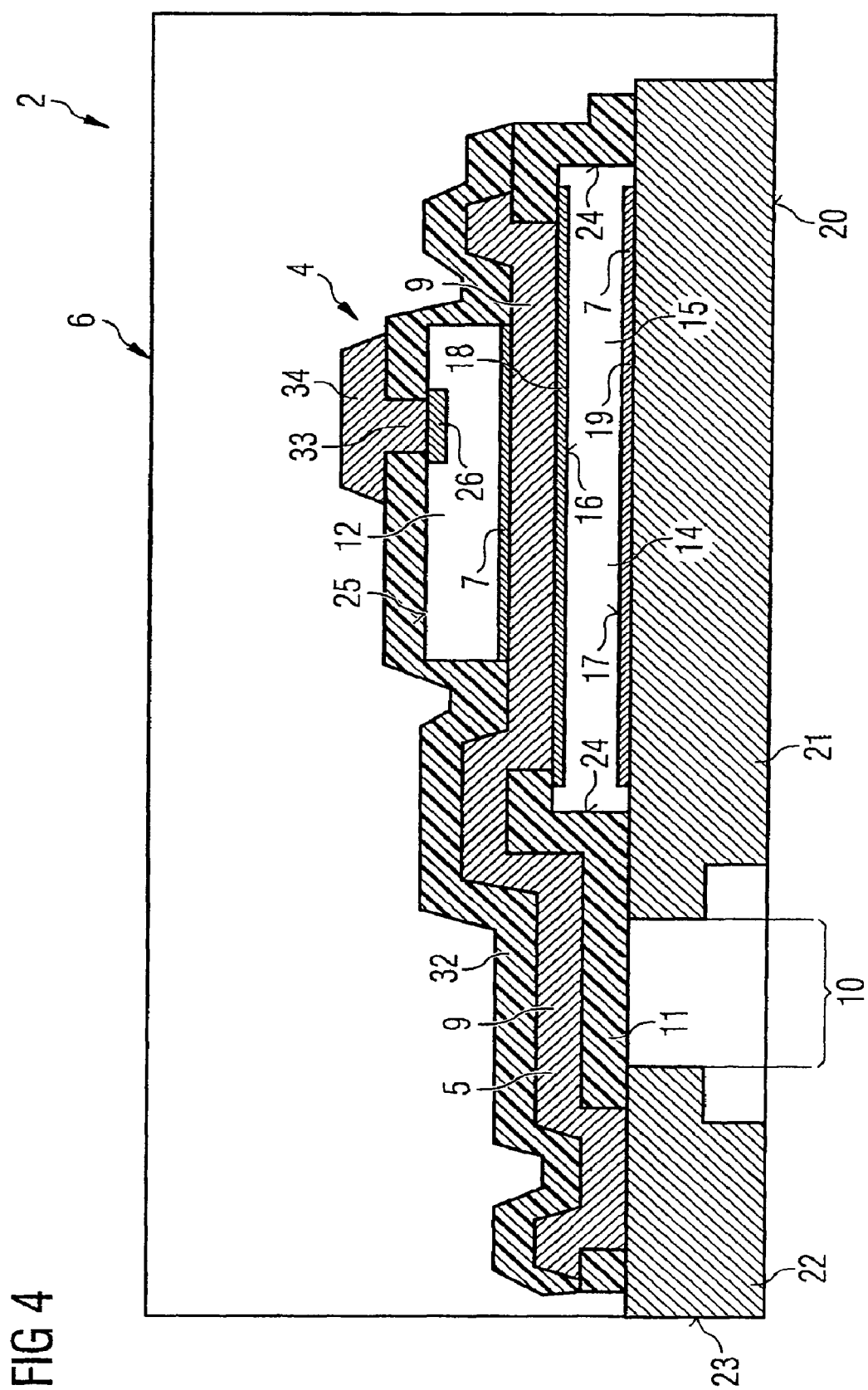
FIG. 4 shows a schematic cross section through a power semiconductor device of a second embodiment having a semiconductor chip stack.

FIG. 4 shows a schematic cross section through a power semiconductor device 2 of a second embodiment having a semiconductor chip stack 4. Components having the same functions as in the first embodiment are labeled using the same reference symbols and are not additionally discussed. In this case too, the semiconductor chip 12 is applied, by way of its rear side 13, to the conductive layer 9 and a broad insulation layer 32 which, in turn, has a large area and is planar is applied over the entire conductive layer and the top side 25 of the stacked semiconductor chip 12, so that further metal wiring 34 can be fitted to said insulation layer. Through-contacts 33 lead from the metal wiring 34 to the contact areas 26 on the active top side 25 of the stacked semiconductor chip 12. This second embodiment thus completely manages without bonding connections.

Figure 5:
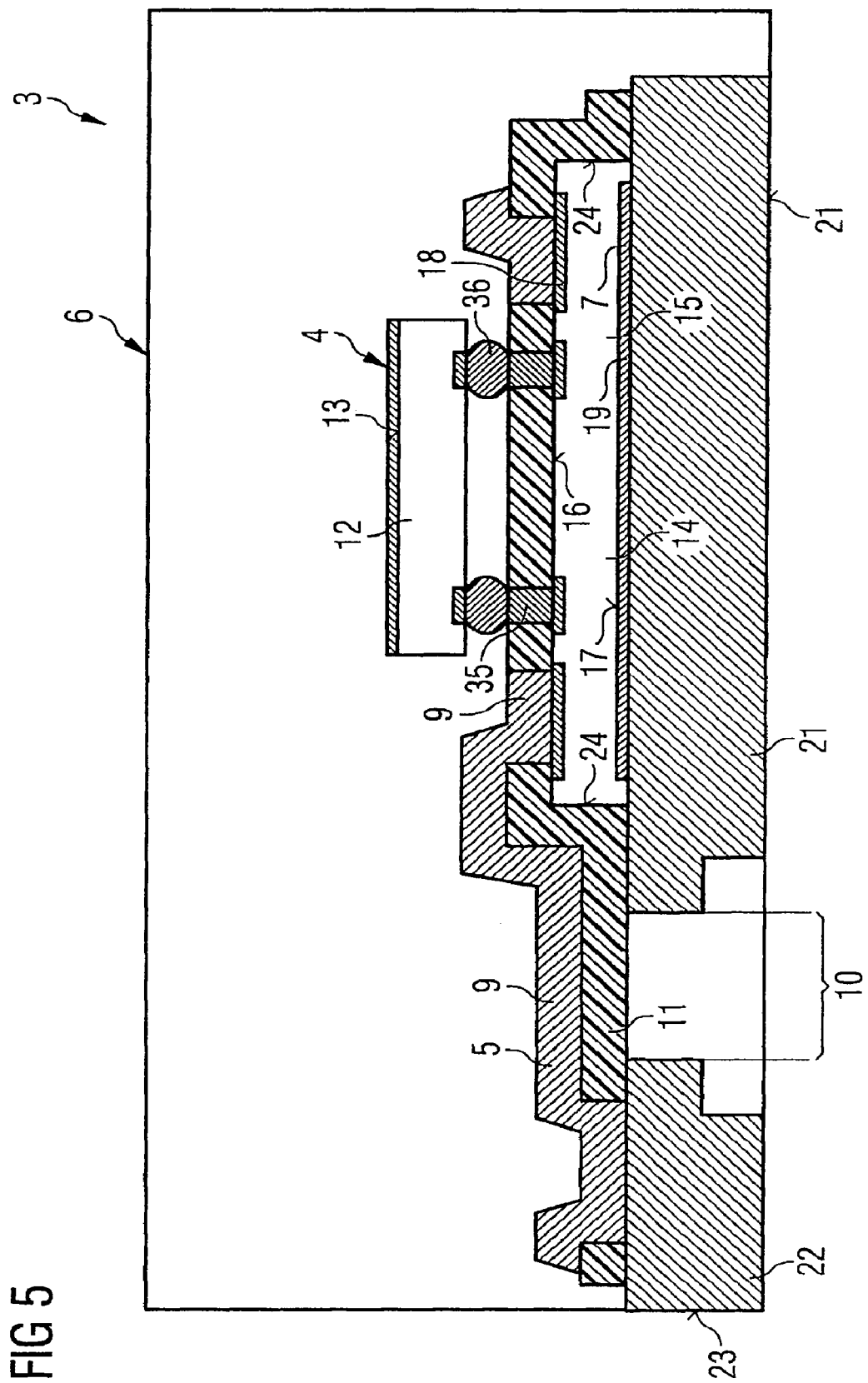
FIG. 5 shows a schematic cross section through a power semiconductor device of a third embodiment.
Figure 6:
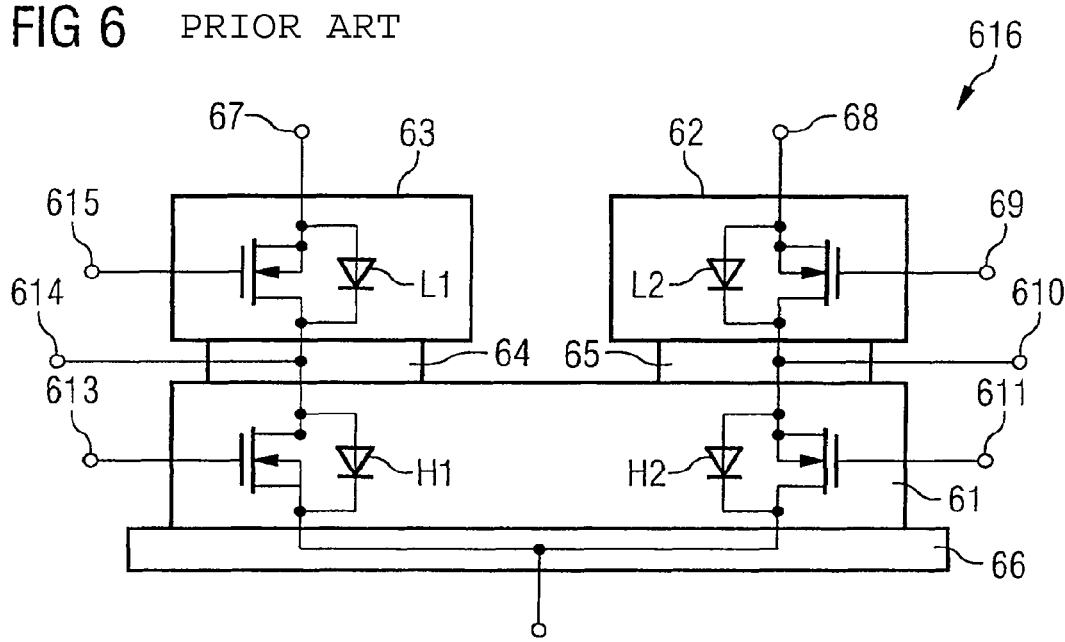
FIG. 6 shows a basic schematic diagram of an H-bridge circuit according to the prior art.

FIG. 5 shows a schematic cross section through a power semiconductor device 3 of a third embodiment. In this case too, components having the same functions as in the preceding embodiments are labeled using the same reference symbols and are not additionally discussed. The difference between the third embodiment and the preceding embodiments is that the conductive layer 9 is patterned in such a manner that it has metal contacts 35 whose arrangement and size are matched to the arrangement and size of flip-chip contacts 36 of a stacked semiconductor chip 12. The different embodiments 1 to 3 are used to show that the conductive layer 9 makes it possible to stack a multiplicity of different semiconductor chips on the conductive layer 9 so that other functions can also be implemented in addition to the bridge circuits shown in FIG. 6.

What is claimed is:

1. A power semiconductor device comprising a semiconductor chip stack and at least one line within a housing which electrically connect large-area contact regions of power semiconductor device components within the housing to one another, and further comprising an insulating layer, the at least one line having a large-area planar conductive layer which is supported by the insulating layer and electrically connects the large-area contact regions to one another.

2. The power semiconductor device according to claim 1, wherein the planar conductive layer bridges a gap between the components.

3. The power semiconductor device according to claim 1, wherein a chip of the semiconductor chip stack is arranged, by way of its rear side, on the planar conductive layer.

4. The power semiconductor device according to claim 1, wherein the semiconductor chip stack has, as a base semiconductor chip, a power semiconductor chip which has large-area electrodes on its top side and on its rear side.

5. The power semiconductor device according to claim 4, wherein the rear side electrode of the power semiconductor chip is arranged on a large-area surface-mountable external contact of the power semiconductor device.

6. The power semiconductor device according to claim 4, wherein the top side of the power semiconductor chip has a large-area second electrode which is connected to the planar conductive layer by a material joint.

7. The power semiconductor device according to claim 1, wherein a portion of the large-area planar conductive layer bridges a gap between a flat lead chip pad and an outer edge contact on an edge side of the power semiconductor device, wherein the portion of the large-area planar conductive layer is supported by the insulating layer.

8. The power semiconductor device according to claim 1, wherein the large-area planar conductive layer is matched to the edge contour of a power semiconductor chip of the semiconductor chip stack.

9. The power semiconductor device according to claim 1, wherein the stacked semiconductor chip is a logic chip or a control chip.

10. A power semiconductor device comprising a semiconductor chip stack and lines within a housing which electrically connect large-area contact regions of power semiconductor device components within the housing to one another, at least one of the lines having a large-area planar conductive layer which electrically connects the large-area contact regions to one another, wherein the planar conductive layer is patterned in a region of the stacked semiconductor chip, the pattern of the planar conductive layer being matched to a flip-chip arrangement of the stacked semiconductor chip.

11. A power semiconductor device comprising a semiconductor chip stack and at least one line within a housing which electrically connect large-area contact regions of power semiconductor device components within the housing to one another, the at least one line having a large-area planar conductive layer which electrically connects the large-area contact regions to one another, wherein two large-area planar conductive layers are arranged on source electrodes of a power semiconductor chip having two high-side switches, and two power semiconductor chips are arranged as low-side switches of an H-bridge circuit on the two large-area planar conductive layers.

12. A power semiconductor device comprising a semiconductor chip stack comprising at least one power semiconductor device and at least one connection layer within a housing, and further comprising an insulating layer, wherein the connection layer electrically connects at least one large-area contact region of the power semiconductor device component within the housing and wherein at least one of the connection layer comprises a large-area planar conductive layer which is supported by the insulating layer and electrically connects the large-area contact regions.

13. The power semiconductor device according to claim 12, wherein the planar conductive layer bridges a gap between the components.

14. The power semiconductor device according to claim 12, wherein a chip of the semiconductor chip stack is arranged, by way of its rear side, on the planar conductive layer.

15. The power semiconductor device according to claim 12, wherein the semiconductor chip stack has, as a base semiconductor chip, a power semiconductor chip which has large-area electrodes on its top side and on its rear side.

16. The power semiconductor device according to claim 15, wherein the rear side electrode of the power semiconductor chip is arranged on a large-area surface-mountable external contact of the power semiconductor device.

17. The power semiconductor device according to claim 15, wherein the top side of the power semiconductor chip has a large-area second electrode which is connected to the planar conductive layer by a material joint.

18. The power semiconductor device according to claim 12, wherein a portion of the large-area planar conductive layer bridges a gap between a flat lead chip pad and an outer edge contact on an edge side of the power semiconductor device, wherein the portion of the large-area planar conductive layer is supported by the insulating layer.

19. The power semiconductor device according to claim 12, wherein the large-area planar conductive layer is matched to the edge contour of a power semiconductor chip of the semiconductor chip stack.

20. The power semiconductor device according to claim 12, wherein the stacked semiconductor chip is a logic chip or a control chip.

21. A power semiconductor device comprising a semiconductor chip stack comprising at least one power semiconductor device and at least one connection layer within a housing, wherein the connection layer electrically connects at least one large-area contact region of the power semiconductor device component within the housing and wherein at least one of the connection layer comprises a large-area planar conductive layer which electrically connects the large-area contact regions, wherein the planar conductive layer is patterned in a region of the stacked semiconductor chip, the pattern of the planar conductive layer being matched to a flip-chip arrangement of the stacked semiconductor chip.

22. A power semiconductor device comprising a semiconductor chip stack comprising at least one power semiconductor device and at least one connection layer within a housing, wherein the connection layer electrically connects at least one large-area contact region of the power semiconductor device component within the housing and wherein at least one of the connection layer comprises a large-area planar conductive layer which electrically connects the large-area contact regions, wherein two large-area planar conductive layers are arranged on source electrodes of a power semiconductor chip having two high-side switches, and two power semiconductor chips are arranged as low-side switches of an H-bridge circuit on the two large-area planar conductive layers.

* * * * *